(12) United States Patent
Kominato et al.

(10) Patent No.: US 11,327,396 B2
(45) Date of Patent: May 10, 2022

(54) MASK BLANK

(71) Applicant: HOYA CORPORATION, Tokyo (JP)

(72) Inventors: Atsushi Kominato, Tokyo (JP); Toshiyuki Suzuki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 95 days.

(21) Appl. No.: 16/085,316

(22) PCT Filed: Mar. 8, 2017

(86) PCT No.: PCT/JP2017/009201
§ 371 (c)(1),
(2) Date: Sep. 14, 2018

(87) PCT Pub. No.: WO2017/169587
PCT Pub. Date: Oct. 5, 2017

(65) Prior Publication Data
US 2019/0064649 A1    Feb. 28, 2019

(30) Foreign Application Priority Data

Mar. 29, 2016 (JP) .............................. JP2016-065394

(51) Int. Cl.
| | | |
|---|---|---|
| G03F 1/32 | (2012.01) | |
| G03F 1/54 | (2012.01) | |
| G03F 1/80 | (2012.01) | |
| G03F 1/26 | (2012.01) | |
| H01L 21/033 | (2006.01) | |

(52) U.S. Cl.
CPC .................. *G03F 1/32* (2013.01); *G03F 1/26* (2013.01); *G03F 1/54* (2013.01); *G03F 1/80* (2013.01); *H01L 21/0337* (2013.01)

(58) Field of Classification Search
CPC ........................................................ G03F 1/26
See application file for complete search history.

(56) References Cited

U.S. PATENT DOCUMENTS

| | | | |
|---|---|---|---|
| 2002/0058186 A1 | 5/2002 | Nozawa et al. | |
| 2002/0086220 A1 | 7/2002 | Nozawa et al. | |
| 2005/0053845 A1 | 3/2005 | Becker et al. | |
| 2006/0257752 A1 | 11/2006 | Kim et al. | |
| 2010/0167185 A1 | 7/2010 | Suzuki et al. | |
| 2011/0287346 A1 | 11/2011 | Sakai et al. | |
| 2013/0095415 A1 | 4/2013 | Nam et al. | |
| 2015/0079502 A1 | 3/2015 | Suzuki et al. | |
| 2015/0111134 A1* | 4/2015 | Suzuki ...................... | G03F 1/82 430/5 |
| 2015/0198873 A1 | 7/2015 | Okubo et al. | |
| 2015/0355537 A1 | 12/2015 | Yamada et al. | |
| 2016/0377975 A1 | 12/2016 | Matsumoto et al. | |
| 2017/0168384 A1 | 6/2017 | Shishido et al. | |

FOREIGN PATENT DOCUMENTS

| | | |
|---|---|---|
| JP | 2010-039300 A | 2/2010 |
| JP | 2011-112824 A | 6/2011 |
| JP | 2011-112982 A | 6/2011 |
| JP | 2016-004223 A | 1/2016 |
| KR | 20070096749 A | 10/2007 |

OTHER PUBLICATIONS

SG11201807932X, "Written Opinion" dated Dec. 19, 2019.
Notification of Reasons for Refusal for Japanese Patent Application No. 2017-547187 dated Jul. 4, 2018.
International Search Report for PCT/JP2017/009201 dated May 23, 2017 [PCT/ISA/210].
SG11201807932X, "Invitation to Respond to Written Opinion", dated Sep. 30, 2020, 6 pages.
SG11201807932X, "Replacement Invitation to Respond to Written Opinion", dated Oct. 29, 2020, 6 pages.
KR 10-2018-7026745, "Notice of Reasons for Refusal" with Machine Translation, dated Dec. 16, 2020, 40 pages.

* cited by examiner

*Primary Examiner* — Kathleen Duda
(74) *Attorney, Agent, or Firm* — Kilpatrick Townsend & Stockton LLP

(57) ABSTRACT

A mask blank for manufacturing a transfer mask. A thin film (2) includes a material containing a metal, silicon, and nitrogen; a ratio of metal content[atom %] to the total content [atom %] of metal and silicon in the thin film (2) is 15% or less. When the thin film is subjected to an analysis of a secondary ion mass spectrometry and a distribution of a secondary ion intensity of silicon in depth direction, a ratio of 1.6 or less is obtained of (i) a maximum peak [Counts/sec] of a secondary ion intensity of silicon at a surface layer region, which is opposite from a transparent substrate (1), of the thin film (2), divided by (ii) an average value [Counts/sec] of a secondary ion intensity of silicon in a depth direction of an inner region, which is a region excluding the surface layer region and a vicinity region with an interface, of the transparent substrate (1) of the thin film (2).

5 Claims, 4 Drawing Sheets

FIG. 2
Fig. 2(a)
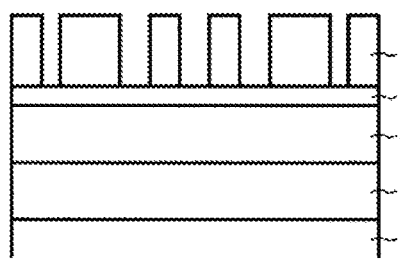
Fig. 2(e)
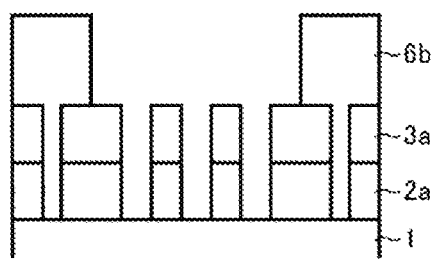
Fig. 2(b)
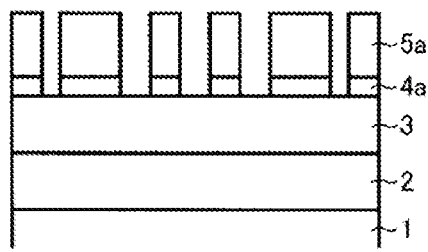
Fig. 2(f)
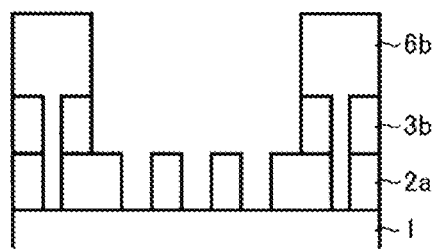
Fig. 2(c)
Fig. 2(g)
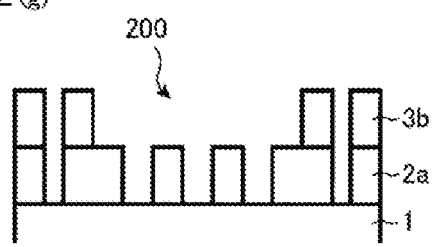
Fig. 2(d)
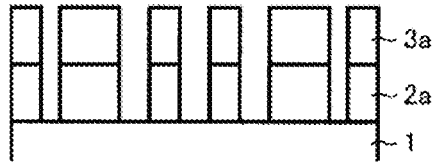

MASK BLANK

CROSS REFERENCE TO RELATED APPLICATIONS

This application is a National Stage of International Application No. PCT/JP2017/009201 filed Mar. 8, 2017, claiming priority based on Japanese Patent Application No. 2016-065394 filed Mar. 29, 2016, the disclosure of which is incorporated herein in its entirety by reference.

TECHNICAL FIELD

This invention relates to a mask blank, and a method for manufacturing a transfer mask using the mask blank. Further, this invention relates to a method for manufacturing a semiconductor device using the transfer mask.

BACKGROUND ART

Generally, in a manufacturing process of a semiconductor device, photolithography is used to form a fine pattern. Multiple substrates called transfer masks are usually utilized in forming the fine pattern. In miniaturization of a semiconductor device pattern, it is necessary to shorten the wavelength of an exposure light source used in the photolithography, in addition to miniaturization of a mask pattern formed on the transfer mask. Shortening of wavelength has been advancing in recent years from the use of KrF excimer laser (wavelength 248 nm) to ArF excimer laser (wavelength 193 nm) as an exposure light source in the manufacture of semiconductor devices.

As for the types of a transfer mask, a half tone phase shift mask is known in addition to a conventional binary mask having a light shielding pattern made of a chromium-based material on a transparent substrate. Molybdenum silicide (MoSi)-based material is widely used for a phase shift film of the half tone phase shift mask. Publication 1 discloses a mask blank with an optically semitransmissive film including a metal such as molybdenum, silicon, and nitrogen as main components. Moreover, in Publication 1, thermal treatment is carried out on the optically semitransmissive film on the transparent substrate for the purpose of enhancing chemical resistance and improving film stress.

There is a problem in a transfer mask with a pattern of a thin film made of a transition metal silicide-based material such as molybdenum silicide of having rather low durability to ArF excimer laser exposure light (hereafter referred to as ArF light fastness), and short use life of the transfer mask. Publication discloses performing heat treatment of 450° C.–900° C. under oxygen-containing atmosphere on a mask blank having a thin film made of a material containing a compound of a transition metal silicide on a transparent substrate. Through the heat treatment, a layer including silicon and oxygen is formed on a surface layer of the thin film so that ArF light fastness can be enhanced.

On the other hand, a half tone phase shift mask (hereafter simply referred to as a phase shift mask, when no particular distinction is needed) generally has a structure where a half tone phase shift film having a transfer pattern on a transparent substrate (hereafter simply referred to as a phase shift film) and a light shielding film having a light shielding pattern are stacked, as disclosed in Publication 3. A phase shift film and a light shielding film are often made of materials having etching selectivity relative to each other. In the case where a transition metal silicide-based material is used for a phase shift film, a material containing chromium is often used for a light shielding film.

PRIOR ART PUBLICATIONS

Patent Publications

Publication 1:
Japanese Patent Application Publication 2002-162726
Publication 2:
Japanese Patent Application Publication 2010-156880
Publication 3:
Japanese Patent Application Publication 2015-191218

SUMMARY OF THE INVENTION

Problem to be Solved by the Invention

In recent years, advances in miniaturization and densification of a transfer mask pattern have been accelerating, causing an increase in the cost of transfer masks. Due to such a background, there are growing needs for increasing the number of which exposure transfer is possible with a single transfer mask, namely, extending the use life of a transfer mask.

As exposure transfer using an exposure apparatus is repeated on a transfer mask, foreign matters such as haze generate on a thin film pattern due to various factors. Currently, it is difficult to completely inhibit the occurrence of the haze. Therefore, the transfer mask needs to be cleaned regularly. While various methods are suggested for cleaning methods of the transfer mask, a cleaning method that does not cause any damage on a thin film pattern has not been confirmed so far. Namely, as cleaning of a transfer mask is repeated, decreasing in film of the thin film pattern and oxidation from the surface layer advance. When the thin film pattern of the transfer mask is unable to satisfy predetermined optical characteristics, the service life of the transfer mask is over.

There has been a problem in a transfer mask having a transfer pattern formed on a thin film made of a material containing a metal, silicon, and nitrogen (hereafter referred to as a metal silicide nitride-based material) of having a low chemical resistance upon chemical cleaning. As disclosed in Publication 1, by subjecting a thin film made of a metal silicide nitride-based material on a transparent substrate under thermal treatment at 150° C. or more, chemical resistance of the thin film is improved compared to chemical resistance before the thermal treatment. Further, when a thin film made of a metal silicide nitride-based material is subjected to heat treatment under 450° C.–900° C. in an oxygen-containing atmosphere as disclosed in Publication 3, chemical resistance of the thin film is further improved. However, it is difficult to significantly improve chemical resistance only by subjecting a thin film under heat treatment. Therefore, further extension of use life of a transfer mask could not be made, which had been a problem.

On the other hand, a phase shift mask is manufactured from a mask blank having a structure where a phase shift film and a light shielding film are stacked in this order on a transparent substrate. This phase shift film is often made of a metal silicide nitride-based material. A common process of manufacturing a phase shift mask from the mask blank is initially forming a transfer pattern that should be formed on a phase shift film on a light shielding film by dry etching, and subsequently dry etching using a light shielding film having a transfer pattern as a mask to form a transfer pattern on the phase shift film, as described in Publication 3. In this case, the transfer pattern is formed on the phase shift film, followed by dry etching for forming a pattern (light shielding band, etc.) to be formed on the light shielding film. In this circumstance, excluding a part of regions where the light shielding film remains as a light shielding pattern, the light shielding film on the phase shift film is removed by dry etching. Namely, most of the light shielding film is removed in the region where the transfer pattern is formed.

In the case where a light shielding film is made of a chromium-based material, mixed gas of chlorine-based gas and oxygen gas is used as etching gas in dry etching for removing the light shielding film. A transition metal silicide-based material forming the phase shift film has a sufficient etching durability to obtain etching selectivity to dry etching using mixed gas of chlorine-based gas and oxygen gas between the chromium-based material forming the light shielding film. However, in the case where the phase shift film is made of a metal silicide nitride-based material, it is impossible that the phase shift film is not etched at all by etching using mixed gas of chlorine-based gas and oxygen gas.

In recent years, difference in density of a pattern in plan view of a transfer pattern formed on a phase shift film has been increasing. During dry etching to form a light shielding pattern on a light shielding film, the light shielding film is under the condition of having a pattern to be formed on the phase shift film, and having large difference in density of the light shielding film in plan view. Carrying out dry etching for forming a light shielding pattern on the light shielding film under such a condition causes greater difference in etching time between when removal of an unnecessary light shielding film is first completed in a certain region in plan view and when removal is finally completed in another region in plan view (i.e., when the light shielding pattern is finished). In this case, the region where the removal of the light shielding film is first completed is kept exposed to etching gas on the surface of the phase shift film positioned immediately below until the light shielding pattern is completed. This causes damage on a surface layer of the phase shift film, which may result in predetermined optical characteristics as a phase shift film not being satisfied, and had been a problem.

This invention was made to solve the conventional problem, in which the purpose of the invention is to provide a mask blank having a thin film for pattern formation made of a material containing a metal, silicon, and nitrogen on a transparent substrate, where the mask blank includes a thin film with significantly improved chemical resistance and durability to dry etching by mixed gas of chlorine-based gas and oxygen gas. Another purpose is to provide a method for manufacturing such a mask blank. Further purpose is to provide a method for manufacturing a transfer mask from such a mask blank. Moreover, the purpose of this invention is to provide a method for manufacturing a semiconductor device using such a transfer mask.

Means for Solving the Problem

For solving the above problem, this invention includes the following structures.

(Structure 1)

A mask blank including a thin film for pattern formation on a transparent substrate,
in which the thin film is made of a material containing a metal, silicon, and nitrogen,
in which a ratio of a content [atom %] of the metal divided by a total content [atom %] of the metal and silicon in the thin film is 15% or less, and
in which when the thin film is subjected to an analysis of a secondary ion mass spectrometry and a distribution of a secondary ion intensity of silicon in depth direction is obtained, a ratio of a maximum peak [Counts/sec] of the secondary ion intensity of silicon at a surface layer region, which is opposite from a transparent substrate, of the thin film divided by an average value [Counts/sec] of the secondary ion intensity of silicon in a depth direction of an inner region, which is a region excluding the surface layer region and a vicinity region with an interface of the transparent substrate, of the thin film is 1.6 or less.

(Structure 2)

The mask blank according to Structure 1, in which the surface layer region is a region ranging from a surface on the thin film opposite from the transparent substrate to a region up to a depth of 10 nm toward the transparent substrate.

(Structure 3)

The mask blank according to Structure 1 or 2, in which the vicinity region is a region ranging from an interface with the transparent substrate to a region up to a depth of 20 nm toward the surface layer region.

(Structure 4)

The mask blank according to any one of Structures 1 to 3, in which a distribution of the secondary ion intensity of silicon in a depth direction is obtained under a measurement condition where a primary ion species is $Cs^+$, a primary accelerating voltage is 2.0 kV, and an irradiating region of a primary ion is an inner region of a square having a side of 120 μm.

(Structure 5)

The mask blank according to any one of Structures 1 to 4, in which when the thin film is subjected to an analysis of a secondary ion mass spectrometry and a distribution of a secondary ion intensity of oxygen in depth direction is also obtained, an average value of the secondary ion intensity of oxygen of the inner region in a depth direction is 2000 [Counts/sec] or less.

(Structure 6)

The mask blank according to any one of Structures 1 to 5, in which the thin film is a phase shift film having a function to transmit an ArF excimer laser exposure light at a transmittance of 1% or more, and a function to generate a phase difference of 150 degrees or more and 190 degrees or less between the exposure light transmitted through the thin film and the exposure light transmitted through air for a same distance as a thickness of the thin film.

(Structure 7)

The mask blank according to Structure 6, in which a light shielding film is provided on the phase shift film.

(Structure 8)

The mask blank according to Structure 7, in which the light shielding film is made of a material containing chromium.

(Structure 9)

A method for manufacturing a mask blank including a thin film for pattern formation on a transparent substrate, including the steps of:
forming the thin film on the transparent substrate, the thin film made of a material containing a metal, silicon, and nitrogen, in which a ratio of a content [atom %] of the metal divided by a total content [atom %] of the metal and silicon is 15% or less;

performing a first heat treatment in which the thin film is subjected to a heat treatment in gas containing oxygen at a temperature below 300° C.; and performing a second heat treatment in which the thin film after the first heat treatment is subjected to a heat treatment in gas containing oxygen at a temperature of 300° C. or more.

(Structure 10)

The method for manufacturing a mask blank according to Structure 9 in which the thin film, when subjected to an analysis of a secondary ion mass spectrometry and a distribution of a secondary ion intensity of silicon in depth direction of the thin film is obtained, has a ratio of a maximum peak [Counts/sec] of the secondary ion intensity of silicon at a surface layer region, which is opposite from a transparent substrate, of the thin film divided by an average value [Counts/sec] of the secondary ion intensity of silicon in a depth direction of an inner region, which is a region excluding the surface layer region and a vicinity region with an interface of the transparent substrate, of the thin film of 1.6 or less.

(Structure 11)

The method for manufacturing a mask blank according to Structure 10, in which the surface layer region is a region ranging from a surface on the thin film opposite from the transparent substrate to a region up to a depth of 10 nm toward the transparent substrate.

(Structure 12)

The method for manufacturing a mask blank according to Structure 10 or 11, in which the vicinity region is a region ranging from an interface with the transparent substrate to a region up to a depth of 20 nm toward the surface layer region.

(Structure 13)

The method for manufacturing a mask blank according to any one of Structures 10 to 12, in which a distribution of the secondary ion intensity of silicon in depth direction is obtained under a measurement condition where a primary ion species is $Cs^+$, a primary accelerating voltage is 2.0 kV, and an irradiating region of a primary ion is an inner region of a square having a side of 120 μm.

(Structure 14)

The method for manufacturing a mask blank according to any one of Structures 10 to 13, in which the thin film, when subjected to an analysis of a secondary ion mass spectrometry and a distribution of a secondary ion intensity of oxygen in depth direction is obtained, has an average value of the secondary ion intensity of oxygen of the inner region in depth direction of 2000[Counts/sec] or less.

(Structure 15)

The method for manufacturing a mask blank according to any one of Structures 9 to 14, in which the thin film is a phase shift film having a function to transmit an ArF excimer laser exposure light at a transmittance of 1% or more and a function to generate a phase difference of 150 degrees or more to 190 degrees or less between the exposure light transmitted through the thin film and the exposure light transmitted through air for a same distance as a thickness of the thin film.

(Structure 16)

The method for manufacturing a mask blank according to Structure 15, including a step of forming a light shielding film on a thin film which is a phase shift film after performing the second heat treatment.

(Structure 17)

The method for manufacturing a mask blank according to Structure 16, in which the light shielding film is made of a material containing chromium.

(Structure 18) A method for manufacturing a transfer mask including a step of forming a transfer pattern on the thin film of the mask blank according to any one of Structures 1 to 8 by dry etching.

(Structure 19)

A method for manufacturing a transfer mask including a step of forming a transfer pattern on the thin film of the mask blank manufactured by the method for manufacturing a mask blank according to any one of Structures 9 to 17 by dry etching.

(Structure 20)

A method for manufacturing a semiconductor device including a step of exposure-transferring a transfer pattern on a resist film on a semiconductor substrate using a transfer mask manufactured by the method for manufacturing a transfer mask according to Structure 18 or 19.

Effect of the Invention

The mask blank of this invention has a significantly improved chemical resistance and durability to dry etching by mixed gas of chlorine-based gas and oxygen gas, even in the case where a thin film for pattern formation is made from a material containing a metal, silicon, and nitrogen. Therefore, a transfer mask manufactured from this mask blank can significantly extend its use life compared to conventional transfer masks.

BRIEF DESCRIPTION OF THE DRAWINGS

FIGS. 2(*a*)-2(*g*) are schematic cross-sectional views showing a manufacturing step of the phase shift mask of an embodiment of this invention.

EMBODIMENTS FOR CARRYING OUT THE INVENTION

Figure 1:
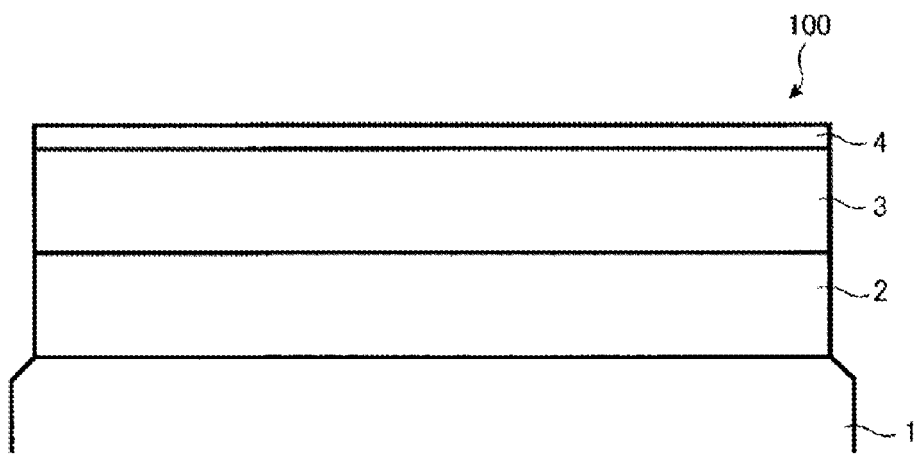
FIG. 1 is a cross-sectional view showing a structure of a mask blank of an embodiment of this invention.

Each embodiment of this invention is explained below.

The inventors of this invention made diligent studies on a structure of a thin film for pattern formation made of a material containing a metal, silicon, and nitrogen having high chemical resistance and high durability to dry etching by mixed gas of chlorine-based gas and oxygen gas. It is possible to improve chemical resistance and dry etching durability of a thin film by forming the entire thin film into a crystalline, or forming a surface layer of a thin film from a crystalline layer (layer of crystal structure of silicon dioxide). However, a crystalline layer existing in a thin film causes poor line edge roughness (LER) of a pattern side wall when a pattern is formed on the thin film and cannot satisfy the conditions required for a transfer mask having a fine pattern. A thin film for pattern formation should have an amorphous structure or a microcrystalline structure.

Thus, consideration was made to form a thin film into an amorphous structure, while improving chemical resistance and dry etching durability by increasing denseness of the thin film. A thin film for pattern formation of a mask blank is generally formed through sputtering method. Since it is indispensable to generate plasma of gas such as noble gas in a film forming chamber in formation of a thin film by the sputtering method, it is necessary that the interior of a film forming chamber is low in pressure. A thin film formed in such a low pressure film forming chamber tends to have low denseness. A method known as improving denseness of a thin film formed through the sputtering method is heat treatment (annealing). However, in the case of heating a thin film at a temperature higher than 900° C. which is a condition for heat treatment disclosed in Publication 3, degradation is inevitable even if a transparent substrate is made of a synthetic quartz glass with high heat resistance. There is a limitation to simply subject a thin film on a transparent substrate under high-temperature heat treatment to improve denseness of the thin film.

The inventors of this invention performed heat treatments on a thin film on a transparent substrate under various conditions and verified chemical resistance and dry etching durability on the thin film after the heat treatment. As a result, conditions of heat treatment to obtain a thin film having chemical resistance and dry etching durability higher than conventional thin films were found. Concretely, a two-stage heat treatment was carried out on a thin film made of a metal silicide nitride-based material on a transparent substrate, including initially performing a heat treatment at a temperature of less than 300° C. in the atmosphere (in oxygen-containing gas), and on the heated thin film, performing a heat treatment at a temperature of 300° C. or more in the atmosphere (in oxygen-containing gas) as in conventional methods. (Performing only the heat treatment at a temperature of 300° C. or more in the atmosphere (in oxygen-containing gas) on the thin film is hereafter referred to as the conventional, one-stage heat treatment.)

Based on the result, difference in physical properties of the thin film was verified between a thin film subjected to the two-stage heat treatment as mentioned above and a thin film subjected to the conventional, one-stage heat treatment, the thin films being made of a similar metal silicide nitride-based material. However, no clear difference was found between the two thin films when analyzed through composition analysis (X-ray photoelectron spectroscopy, Rutherford Backscattering Spectrometry). Further, film density of the thin films was measured by X-ray reflectometry method, and no clear difference was obtained between the two thin films. Moreover, while layers under oxidation exist on the surface layers of the two thin films, film density of those surface layers could not be measured solely.

As a result of further studies, the inventors of this invention found out that when the two thin films are analyzed by a secondary ion mass spectrometry (SIMS: Secondary Ion Mass Spectrometry), a maximum peak of a secondary ion intensity of silicon of the surface layer region of the thin film clearly differs between the two thin films. Concretely, the maximum peak of the secondary ion intensity of silicon is apparently smaller in the thin film subjected to the two-stage heat treatment compared to the thin film subjected to the conventional, one-stage heat treatment, and the difference went beyond the scope of measurement error. On the other hand, no clear difference was found between the two thin films on the secondary ion intensity of oxygen, nitrogen, and metal, respectively, which are other primary elements forming the thin film.

A study was made on the reason that smaller maximum peak of secondary ion intensity of silicon on a surface layer region of a thin film causing improvements in chemical resistance and etching durability of the thin film, and the following supposition was made. The following supposition is based on suppositions of the inventors of this invention as of the filing, which by no means limits the scope of this invention.

In a secondary ion mass spectrometry, primary ions such as cesium ion accelerated by applying accelerating voltage are collided on a surface of an object to be measured, and the number of secondary ions that are ejected from the surface due to the collision of the primary ion is measured. The thin film subjected to the two-stage heat treatment having less secondary ion intensity of silicon irrespective of the compositions of the two thin films being identical indicates that silicon in the thin film subjected to the two-stage heat treatment is in the state where silicon is less likely to eject out from a surface of the thin film compared to silicon of the thin film subjected to the conventional, one-stage heat treatment, or in the state of being less likely to be ionized.

Silicon that is less likely to be ionized is considered as less likely to cause chemical reaction to chemicals. This can be considered as a factor that the thin film subjected to the two-stage heat treatment has higher chemical resistance than the thin film subjected to the conventional, one-stage heat treatment. Further, in the state where silicon is less likely to eject out from a surface of the thin film, the surface of the thin film is considered as having high durability to impact of etching of a physical action when exposed to dry etching by mixed gas of chlorine-based gas and oxygen gas. This can be considered as a factor that the thin film subjected to the two-stage heat treatment has higher durability to dry etching by mixed gas of chlorine-based gas and oxygen gas than the thin film subjected to the conventional, one-stage heat treatment.

On the other hand, through further verification, it was discovered that depending on metal content of a metal silicide nitride-based material, there are cases where high chemical resistance and high etching durability cannot be obtained through the two-stage heat treatment under the above conditions. It was found that in the case where a ratio (percentage) of the metal content [atom %] to the total content [atom %] of metal and silicon in the thin film is greater than 15%, there is no substantial difference in chemical resistance and etching durability between the thin film subjected to the two-stage heat treatment under the above conditions and the thin film subjected to the conventional, one-stage heat treatment. On the thin film where the ratio (percentage) of the metal content [atom %] to total content [atom %] of metal and silicon is greater than 15%, an analysis was made by a secondary ion mass spectrometry (SIMS) on each of the thin films subjected to the two-stage heat treatment under the above conditions and the thin film subjected to the conventional, one-stage heat treatment, resulting in no clear difference being observed in the maximum peak of the secondary ion intensity of silicon of the surface layer region of the thin film.

On the other hand, a study was made on forming a thin film having such characteristics of the surface layer region through methods other than the two-stage heat treatment. As a result, as far as the thin film is formed through the sputtering method, a thin film made of a metal silicide nitride-based material having the above surface layer region could not be formed, even if the conditions of the reactive sputtering were adjusted. However, it was discovered that a thin film having a surface layer region similar to the above can be formed through a photo irradiation treatment using a flash lamp, etc. Concretely, a surface of a thin film made of a metal silicide nitride-based material is subjected to a two-stage photo irradiation treatment, in which photo irradiation treatment of relatively weak irradiation intensity (e.g., less than 10 J/cm$^2$) is performed in the atmosphere (in oxygen-containing gas), and on the thin film subjected to the photo irradiation treatment, photo irradiation treatment of relatively strong irradiation intensity (e.g., 10 J/cm$^2$ or more) is performed in the atmosphere (in oxygen-containing gas).

On the other hand, it was found that a thin film having a surface layer region similar to the above can be formed by subjecting a thin film made of a metal silicide nitride-based material to a two-stage treatment combining the above heat treatment and the photo irradiation treatment. For example, a surface layer region of a thin film can be provided with the above characteristics through a two-stage treatment where a thin film made of a metal silicide nitride-based material is subjected to a heat treatment at a temperature below 300° C. in the atmosphere and to a photo irradiation treatment through the relatively strong irradiation intensity. Further, a surface layer region of a thin film can be provided with the above characteristics by subjecting a thin film made of a metal silicide nitride-based material to a photo irradiation treatment of relatively weak irradiation intensity in the atmosphere, followed by a heat treatment at a temperature of 300° C. or more in the atmosphere.

As a result of the diligent study described above, the mask blank of this invention was completed. Namely, this invention is a mask blank having a thin film for pattern formation on a transparent substrate, in which the thin film is made of a material containing a metal, silicon, and nitrogen, in which a ratio (percentage) of a metal content [atom %] divided by total content [atom %] of metal and silicon in the thin film is 15% or less, and in which when the thin film is subjected to an analysis of secondary ion mass spectrometry and a distribution of a secondary ion intensity of silicon in depth direction (film thickness direction) is obtained, a ratio of a maximum peak [Counts/sec] of the secondary ion intensity of silicon at a surface layer region, which is opposite from a transparent substrate of the thin film divided by an average value [Counts/sec] of the secondary ion intensity of silicon in a depth direction of an inner region excluding the surface layer region and a vicinity region with an interface of the transparent substrate of the thin film is 1.6 or less.

The mask blank of an embodiment of this invention at least includes a thin film for pattern formation on a transparent substrate. The mask blank is applicable to a mask blank for manufacturing a binary mask, a dug-down Levenson type phase shift mask or a CPL (Chromeless Phase Lithography) mask (hereafter collectively referred to as binary mask, etc.), a mask blank for manufacturing a half tone phase shift mask, etc. In the case of a mask blank for manufacturing a binary mask, etc. or a dug-down Levenson type phase shift mask, a thin film for pattern formation is required to have optical characteristics as a light shielding film. Further, in the case of a mask blank for manufacturing a half tone phase shift mask, a thin film for pattern formation is required to have optical characteristics as a phase shift film.

A transparent substrate can be made from synthetic quartz glass, and also from quartz glass, aluminosilicate glass, soda-lime glass, low thermal expansion glass ($SiO_2$—$TiO_2$ glass, etc.), etc. Among the above, synthetic quartz glass is particularly preferable as a material for forming a transparent substrate of the mask blank for having high transmittance to ArF excimer laser light and having high heat resistance to a heat treatment for forming a surface layer region of a thin film.

A thin film for pattern formation is made of a material containing a metal, silicon, and nitrogen. Metal elements to be included in the material for making a thin film for pattern formation are preferably transition metal elements. The transition metal elements in this case can include one or more metal elements among molybdenum(Mo), tantalum (Ta), tungsten(W), titanium(Ti), chromium(Cr), hafnium (Hf), nickel(Ni), vanadium(V), zirconium(Zr), ruthenium (Ru), rhodium(Rh), zinc (Zn), niobium(Nb), and palladium (Pd). Metal elements other than the transition metal elements to be included in a material forming a thin film for pattern formation include aluminum(Al), indium(In), tin (Sn), gallium(Ga), etc. In addition to the elements above, a material forming a thin film for pattern formation can include elements such as carbon(C), hydrogen(H), boron(B), germanium(Ge), and antimony(Sb). A material forming a thin film for pattern formation can include inert gas such as helium(He), argon(Ar), krypton(Kr), and xenon(Xe).

It is required for a thin film for pattern formation that when an analysis of a secondary ion mass spectrometry is carried out and a distribution of a secondary ion intensity of silicon in depth direction is obtained, a ratio of a maximum peak Si_max[Counts/sec] of a secondary ion intensity of silicon at a surface layer region, which is opposite from a transparent substrate, of the thin film divided by an average value Si_avg[Counts/sec] of a secondary ion intensity of silicon in a depth direction (film thickness direction) of an inner region, which is a region excluding a surface layer region and a vicinity region with an interface, of the transparent substrate of the thin film (this ratio is hereafter referred to as "Si_max/Si_avg ratio") is 1.6 or less. A thin film including a surface layer region with Si_max/Si_avg ratio of 1.6 or less has an improved chemical resistance and also has an improved durability to dry etching by mixed gas of chlorine-based gas and oxygen gas. Si_max/Si_avg ratio of a surface layer region of a thin film for pattern formation is preferably 1.55 or less. Further, Si_max/Si_avg ratio of a surface layer region of a thin film for pattern formation is preferably 1.0 or more.

Ratio (percentage) [%] where metal content [atom %] in a thin film for pattern formation is divided by total content [atom %] of metal and silicon (this ratio is hereafter referred to as "M/[M+Si] ratio") is required to be 15% or less. This is because if a thin film for pattern formation has M/[M+Si] ratio of more than 15%, it is difficult to form a thin film of a metal silicide nitride-based material satisfying the condition of Si_max/Si_avg ratio being 1.6 or less. M/[M+Si] ratio of a thin film for pattern formation is preferably 14% or less, and more preferably 13% or less.

On the other hand, M/[M+Si] ratio of a thin film for pattern formation is preferably 1% or more, more preferably 2% or more, and even more preferably 3% or more. This is because in any case of a mask blank for a binary mask, when a thin film for pattern formation is made of a material with M/[M+Si] ratio less than 1%, it would be necessary to form a thin film thicker to satisfy desired optical characteristics.

In obtaining Si_max/Si_avg ratio of a thin film for pattern formation, "surface layer region" of the thin film is preferably a region ranging from a surface, which is opposite from a transparent substrate, of the thin film toward the transparent substrate up to a depth of 10 nm. This is because maximum peak Si_max of a secondary ion intensity of silicon appears in the range between the surface of the thin film and a depth of 10 nm. Another reason is that a secondary ion intensity of silicon in a region ranging from the surface of the thin film to a depth of 10 nm is often affected by oxidation, etc. of the surface of the thin film, and is to reduce the influence on average value Si_avg of the secondary ion intensity of silicon in the inner region of the thin film. The surface layer region of a thin film is preferably a region ranging from a surface opposite from a transparent substrate of the thin film toward the transparent substrate up to a depth of 15 nm.

In obtaining Si_max/Si_avg ratio of a thin film for pattern formation, "vicinity region" is preferably a region ranging from an interface with the transparent substrate toward the surface layer region up to a depth of 20 nm. This is because a secondary ion intensity of silicon in the region ranging from an interface with the transparent substrate toward the surface layer region up to a depth of 20 nm is likely to be affected by the transparent substrate, and is to reduce the influence on average value Si_avg of a secondary ion intensity of silicon in the inner region of the thin film. The vicinity region of a thin film is preferably a region ranging from an interface with the transparent substrate toward the surface layer region up to a depth of 25 nm.

An inner region, which is a region of a thin film for pattern formation excluding a surface layer region and a vicinity region, preferably has less variation in a secondary ion intensity of silicon in depth direction (film thickness direction). For example, a ratio of an absolute value of a value where an average value Si_avg of a secondary ion intensity of silicon is subtracted from a measured value Si_ms of a secondary ion intensity of silicon measured at each depth in the inner region divided by an average value Si_avg of a secondary ion intensity of silicon (this ratio is hereafter referred to as "ABS[Si_ms-Si_avg]/Si_avg ratio") is preferably less than 0.1. Further, ABS[Si_ms-Si_avg]/Si_avg ratio of the inner region is preferably 0.07 or less, and more preferably 0.05 or less. On the other hand, the inner region, which is a region of a thin film for pattern formation excluding a surface layer region and a vicinity region, has a difference of content amount [atom %] of each element forming the inner region in depth direction (film thickness direction), which is preferably 5 atom % or less for each element, and more preferably 3 atom % or less for each element.

Distribution of a secondary ion intensity of silicon in a depth direction (film thickness direction) obtained by performing an analysis by a secondary ion mass spectrometry on a thin film for pattern formation is preferably obtained under a measurement condition where a primary ion species is $Cs^+$, a primary accelerating voltage is 2.0 kV, and an irradiating region of a primary ion is an inner region of a square having a side of 120 μm. By deriving Si_max/Si_avg ratio from the distribution of a secondary ion intensity of silicon in a depth direction of the thin film obtained from this measurement condition, a precise distinction can be made on whether the thin film has improved chemical resistance and etching durability.

In a thin film for pattern formation, when the thin film is subjected to an analysis of a secondary ion mass spectrometry and a distribution of a secondary ion intensity of oxygen in depth direction is also obtained, an average value of a secondary ion intensity of oxygen in a depth direction an inner region, which is a region in the depth direction excluding a surface layer region and a vicinity region, is preferably 2000[Counts/sec] or less. In the case where an average value of a secondary ion intensity of oxygen in depth direction of the inner region of the thin film is greater than 2000[Counts/sec], the inner region of the thin film contains a certain amount or more oxygen. Such a thin film tends to have smaller refractive index n and extinction coefficient k to an exposure light. A thin film having an inner region where both refractive index n and extinction coefficient k are small is unpreferable, since more thickness is required to satisfy desired conditions in both cases of using the thin film for the purpose of a light shielding film and a phase shift film.

In a transfer mask using the mask blank of this invention, any of ArF excimer laser (wavelength: 193 nm), KrF excimer laser (wavelength: 248 nm), and i-line (wavelength: 365 nm) are applicable as an exposure light used in exposure-transfer to an object to be transferred by an exposure apparatus. Generation of haze occurring on a transfer mask is conspicuous when ArF excimer laser is used as the exposure light. Further, in a transfer mask where ArF excimer laser is applied as an exposure light, a transfer pattern formed on a thin film for pattern formation is extremely fine, and a higher durability to dry etching by mixed gas of chlorine-based gas and oxygen gas is required. Therefore, the mask blank of this invention is particularly preferably for exposure-transfer using ArF excimer laser as an exposure light.

While a thin film for pattern formation is formed through reactive sputtering, any sputtering method is applicable, such as DC sputtering, RF sputtering, and ion beam sputtering. It is preferable to apply DC sputtering considering deposition rate. In the case of using a target with low conductivity (target with less metal content), it is preferable to apply RF sputtering and ion beam sputtering; however, it is more preferable to apply RF sputtering considering deposition rate.

A thin film for pattern formation is preferably a light shielding film such as a binary mask, and a phase shift film of a half tone phase shift mask. The light shielding film and the phase shift film in these cases remain on a transparent substrate as a thin film pattern having a transfer pattern formed thereon when the transfer mask is completed. Namely, chemical resistance of the light shielding film and the phase shift film in these cases forms a significant determination factor of use life of the transfer mask.

In the case where a thin film for pattern formation is a light shielding film such as a binary mask, a transfer pattern is often formed on a light shielding film through dry etching using a hard mask film made of a material containing chromium and having a transfer pattern formed thereon as a mask. After the transfer pattern is formed on the light shielding film, the hard mask film needs to be removed through dry etching by mixed gas of chlorine-based gas and oxygen gas. Therefore, a surface layer of the light shielding film preferably has high durability to dry etching by mixed gas of chlorine-based gas and oxygen gas.

In the case where a thin film for pattern formation is a phase shift film of a half tone phase shift mask, a transfer pattern is often formed on a phase shift film through dry etching by using a light shielding film made of a material containing chromium and having a transfer pattern formed thereon as a mask. After forming the transfer pattern on the phase shift film, the light shielding film needs to be removed through dry etching by mixed gas of chlorine-based gas and oxygen gas, excluding a part of regions such as a light shielding band. Therefore, a surface layer of the phase shift film is also required to have high durability to dry etching by mixed gas of chlorine-based gas and oxygen gas.

A thin film for pattern formation is particularly preferably a phase shift film of a half tone phase shift mask. This is because there are more restrictions to the phase shift film on desired optical characteristics than a light shielding film.

EMBODIMENTS

FIG. 1 is a cross-sectional view showing a structure of a mask blank 100 for forming a phase shift mask according to an embodiment of this invention. The mask blank 100 shown in FIG. 1 is for manufacturing a phase shift mask, having a structure where a phase shift film (thin film for pattern formation) 2, a light shielding film 3, and a hard mask film 4 are stacked in this order on a transparent substrate 1.

The phase shift film 2 is required to have a transmittance to an exposure light of 1% or more. At least 1% transmittance to an exposure light is necessary to generate sufficient phase shifting effect between the exposure light transmitted through the interior of the phase shift film and the exposure light transmitted through the air. The transmittance of the phase shift film to an exposure light is preferably 2% or more, and more preferably 3% or more. On the other hand, the transmittance of the phase shift film to an exposure light is preferably 30% or less, more preferably 20% or less, and even more preferably 10% or less.

To obtain a proper phase shifting effect, it is necessary for the phase shift film 2 to be adjusted so as to generate a phase difference in the range of 150 degrees or more and 190 degrees or less between the transmitting exposure light and the light transmitted through the air for the same distance as the thickness of the phase shift film 2. The lower limit of the phase difference in the phase shift film 2 is preferably 155 degrees or more, and more preferably 160 degrees or more. On the other hand, the upper limit of the phase difference in the phase shift film 2 is preferably 180 degrees or less, and more preferably 179 degrees or less. This is for reducing the effect of increase in phase difference caused by minute etching on the transparent substrate 1 upon dry etching for forming a pattern on the phase shift film 2. Another reason is that in recent years, there has been an increasing application of irradiation method of an exposure light on a phase shift mask using an exposure apparatus where exposure light is entered from a direction inclined at a predetermined angle relative to a vertical direction of a film surface of the phase shift film 2.

From the viewpoint of reducing EMF (ElectroMagnetic Field) bias of the phase shift mask manufactured from the mask blank 100, the phase shift film 2 is required to have a thickness of less than 100 nm, more preferably 90 nm or less, and even more preferably 80 nm or less. On the other hand, it is necessary for the thickness of the phase shift film 2 to obtain a proper phase shifting effect as mentioned above, which is required to be 50 nm or more, and preferably 55 nm or more.

The phase shift film 2 is made of a material containing a metal, silicon, and nitrogen. An inner region of the phase shift film 2 is preferably made of a material containing a metal, silicon, and nitrogen. In this case, however, the inner region can permit inclusion of elements that are inevitably mixed upon forming the phase shift film 2 by sputtering. As nitrogen content in the thin film increases, refractive index n of the thin film tends to relatively increase, and extinction coefficient k tends to relatively decrease. Nitrogen content of the phase shift film 2 is preferably 20 atom % or more, more preferably 25 atom % or more, and even more preferably 30 atom % or more. On the other hand, nitrogen content of the material forming the phase shift film 2 is preferably 50 atom % or less, more preferably 45 atom % or less, and even more preferably 40 atom % or less.

The phase shift film 2 is often formed in contact with a surface of the transparent substrate 1. Incidentally, the phase shift film 2 does not have to be formed in contact with a surface of the transparent substrate 1, and an etching stopper film can be provided between the transparent substrate 1 and the phase shift film 2. In this case, the thickness of the etching stopper film should be 10 nm or less, preferably 7 nm or less, and more preferably 5 nm or less. Further, on the viewpoint of effectively functioning as an etching stopper, the thickness of the etching stopper film should be 3 nm or more. The etching stopper film is preferably made of a material containing chromium, or a material containing silicon and aluminum.

In the case of applying an etching stopper film of a material containing silicon and aluminum, extinction coefficient k of the etching stopper film is preferably less than 0.1, more preferably 0.05 or less, and even more preferably 0.01 or less. Further, refractive index n of the etching stopper film in this case is preferably 1.9 or less, and more preferably 1.7 or less. Refractive index n of the etching stopper film is preferably 1.55 or more.

The mask blank 100 has a light shielding film 3 on the phase shift film 2. Optical density in an outer peripheral region of a transfer mask including a phase shift mask is required to be at least 2.0 or more, preferably 2.5 or more, and more preferably 2.8 or more. The phase shift film 2 has a function to transmit an exposure light at a predetermined transmittance, and it is difficult to secure an optical density of a predetermined value with the phase shift film 2 alone. Therefore, it is necessary to stack the light shielding film 3 on the phase shift film 2 at the stage of manufacturing the mask blank 100 to secure lacking optical density. With such a structure of the mask blank 100, the phase shift mask 200 securing a predetermined value of optical density on the outer peripheral region can be manufactured by removing the light shielding film 3 of the region using the phase shift effect (basically transfer pattern forming region) during manufacture of the phase shift mask 200.

A single layer structure and a stacked structure of two or more layers are applicable to the light shielding film 3. Further, each layer in the light shielding film of a single layer structure and the light shielding film with a stacked structure of two or more layers can be configured by approximately the same composition in the thickness direction of the layer or the film, or with a composition gradient in the thickness direction of the layer.

The mask blank 100 in FIG. 1 is configured as a structure where the light shielding film 3 is stacked on the phase shift film 2 without an intervening film. For the light shielding film 3 in the case of this structure, it is necessary to apply a material having sufficient etching selectivity to etching gas used in forming a pattern on the phase shift film 2. The light shielding film 3 in this case is preferably formed from a material containing chromium. Materials containing chromium for forming the light shielding film 3 can include, in addition to chromium metal, a material containing chromium and one or more elements selected from oxygen, nitrogen, carbon, boron, and fluorine.

While a chromium-based material is generally etched by mixed gas of chlorine-based gas and oxygen gas, etching rate of the chromium metal to the etching gas is not as high.

Considering enhancing etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among molybdenum, indium, and tin can be included in the material containing chromium for forming the light shielding film 3. Including one or more elements among molybdenum, indium, and tin can increase etching rate to mixed gas of chlorine-based gas and oxygen gas.

On the other hand, this invention includes, as a mask blank 100 of another embodiment, a structure including another film (etching stopper film) between the phase shift film 2 and the light shielding film 3. In this case, it is preferable to form the etching stopper film from the material containing chromium mentioned above, and the light shielding film 3 from a material containing silicon or a material containing tantalum.

A material containing silicon for forming the light shielding film 3 can include a transition metal, and metal elements other than the transition metal can also be included. The reason is that when a transition metal is included in the light shielding film 3, light shielding performance is significantly improved compared to the case without the transition metal, and the thickness of the light shielding film 3 can be reduced. The transition metals to be included in the light shielding film 3 include any one of a metal such as molybdenum(Mo), tantalum(Ta), tungsten(W), titanium(Ti), chromium(Cr), hafnium(Hf), nickel(Ni), vanadium(V), zirconium(Zr), ruthenium(Ru), rhodium(Rh), zinc(Zn), niobium(Nb), and palladium(Pd), or a metal alloy thereof. Metal elements other than transition metal elements to be included in the light shielding film 3 include aluminum(Al), indium(In), tin(Sn), gallium(Ga), etc.

In the mask blank 100, a preferable structure is that a hard mask film 4 made of a material having etching selectivity to etching gas used in etching the light shielding film 3 is further stacked on the light shielding film 3. Since the light shielding film 3 must have a function to secure a predetermined optical density, there is a limitation to reduce its thickness. The film thickness of the hard mask film 4 is sufficient if the film thickness functions as an etching mask until the completion of dry etching for forming a pattern on the light shielding film 3 immediately below the hard mask film 4, and basically is not limited with regard to optical density. Therefore, the thickness of the hard mask film 4 can be reduced significantly compared to the thickness of the light shielding film 3.

In the case where the light shielding film 3 is made of a material containing chromium, the hard mask film 4 is preferably made of the material containing silicon given above. Since the hard mask film 4 in this case tends to have low adhesiveness with the resist film of an organic material, it is preferable to treat the surface of the hard mask film 4 with HMDS (Hexamethyldisilazane) to enhance surface adhesiveness. The hard mask film 4 in this case is more preferably made of $SiO_2$, SiN, SiON, etc.

Further, in the case where the light shielding film 3 is made of a material containing chromium, materials containing tantalum are also applicable as the materials of the hard mask film 4, in addition to the material containing silicon given above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, and TaBOCN. Further, in the case where the light shielding film 3 is made of a material containing silicon, the hard mask film 4 is preferably made of the material containing chromium given above.

In the mask blank 100, a resist film of an organic material is preferably formed in contact with the surface of the hard mask film 4 at a film thickness of 100 nm or less. In the case of a fine pattern to meet DRAM hp32 nm generation, a SRAF (Sub-Resolution Assist Feature) with 40 nm line width may be provided on a transfer pattern (phase shift pattern) to be formed on the hard mask film 4. However, even in this case, cross-sectional aspect ratio of the resist pattern can be reduced down to 1:2.5 so that collapse and falling off of the resist pattern can be prevented in rinsing and developing, etc. of the resist film. The resist film preferably has a film thickness of 80 nm or less.

On the other hand, in a method for manufacturing the mask blank of this invention, it is preferable to apply the two-stage heat treatment described above. Namely, the method for manufacturing the mask blank of an embodiment of this invention is a method for manufacturing a mask blank including a thin film for pattern formation on a transparent substrate, including the steps of forming the thin film on the transparent substrate, the thin film made of a material including a material containing a metal, silicon, and nitrogen, in which a ratio (percentage) of the metal content [atom %] divided by a total content [atom %] of the metal and silicon is 15% or less; performing a first heat treatment in which the thin film is subjected to a heat treatment in gas containing oxygen at a temperature below 300° C.; and performing a second heat treatment in which the thin film after the first heat treatment is subjected to a heat treatment in gas containing oxygen at a temperature of 300° C. or more.

The step of forming a thin film includes placing a transparent substrate on a substrate stage in a film-forming apparatus, introducing at least nitrogen-based gas and noble gas in the film-forming apparatus, applying voltage on a target containing a metal and silicon, and through reactive sputtering, forming a thin film for pattern formation on a main surface of the transparent substrate. The procedure of the reactive sputtering is as mentioned above. Nitrogen gas or nitrogen compound gas is applied as the nitrogen-based gas to be introduced into the film-forming apparatus. The nitrogen-based gas herein includes, e.g., $N_2$, NO, $NO_2$, $NH_3$, and $HNO_3$. Particularly, nitrogen-based gas herein is preferably nitrogen gas.

Noble gas to be introduced into the film-forming apparatus can include helium, neon, argon, krypton, and xenon. Particularly, the noble gas herein is preferably mixed gas including helium and one or more gases selected from argon, krypton, and xenon. On the gas to be introduced into the film forming chamber, gas that is difficult to completely avoid mixture such as water vapor, gas in the atmosphere, outgas from members in the film forming chamber, etc. may be included within the scope of not affecting various properties required for a thin film formed through reactive sputtering.

A target of the film-forming apparatus is made of a material containing a metal and silicon. The metal in the target is similar to the metal in the thin film for pattern formation. M/[M+Si] ratio of the target is similar to M/[M+Si] ratio in the thin film for pattern formation. In the case of applying DC sputtering for reactive sputtering of the thin film, the target requires a predetermined degree or more conductivity. Considering this point, M/[M+Si] ratio of the target is preferably 2% or more.

In a first heat treatment, a thin film for pattern formation formed in the step of forming the thin film is subjected to heat treatment in gas containing oxygen at a temperature below 300° C. Heating temperature of the heat treatment on the thin film in the first heat treatment is more preferably 290° C. or less. This is because the greater the difference between the heating temperature of heat treatment on the thin film in the first heat treatment and the heating temperature of heat treatment on the thin film in the second heat treatment causes enhancement in silicon in the surface layer region of the thin film less likely to be ionized, and silicon being less likely to eject out when elements of the etching gas collide on the surface of the thin film. Further, the heating temperature of heat treatment on the thin film in the first heat treatment is preferably 200° C. or more. When the heating temperature on the thin film is less than 200° C., it would be difficult to sufficiently incorporate oxygen in the surface layer region of the thin film.

The time for heat treatment in the first heat treatment is preferably 5 minutes or more, and more preferably 10 minutes or more. When the time of heat treatment on the thin film is less than 5 minutes, it would be difficult to sufficiently incorporate oxygen into the surface layer region of the thin film. The time for heat treatment in the first heat treatment is preferably less than 20 minutes, and more preferably 15 minutes or less. When heat treatment with rather low temperature is carried out for a long time, oxygen may penetrate into the inner region of the thin film, which is not preferable.

In the second heat treatment, the thin film for pattern formation after the first heat treatment is subjected to a heat treatment in gas containing oxygen at a temperature of 300° C. or more. The heating temperature of heat treatment on the thin film in the second heat treatment is more preferably 350° C. or more, and more preferably 400° C. or more. By elevating the heating temperature of the second heat treatment, denseness of the thin film can be improved and reduction of film stress can be sought. The heating temperature of heat treatment on the thin film in the second heat treatment is preferably 900° C. or less, more preferably 700° C. or less, and even more preferably 600° C. or less. In subjecting the thin film to heat treatment, the transparent substrate is simultaneously heated at a same temperature as the thin film. When heating temperature on the transparent substrate is too high, the physical properties of the transparent substrate may significantly change, which is not preferable.

The time for heat treatment in the second heat treatment is preferably 30 minutes or more, and more preferably 45 minutes or more. When the time of the high-temperature heat treatment as the second heat treatment is less than 30 minutes, it would be difficult to increase denseness of the thin film. The time of the heat treatment in the second heat treatment is preferably 120 minutes or less.

The heat treatment on the thin film in the first heat treatment and the second heat treatment is carried out in gas containing oxygen. This is for incorporating a certain amount or more oxygen in the surface layer region. These heat treatments can be performed in the atmosphere, and more preferably performed in the air passed through a chemical filter. The heat treatment on the thin film in the first heat treatment and the second heat treatment is preferably annealing. This is because an internal structure of the thin film after the heat treatment can be maintained at a state before the heat treatment (amorphous structure or microcrystalline structure). Further, the second heat treatment is preferably carried out after the heat treatment of the first heat treatment, leaving it until the internal temperature of the thin film reaches a normal temperature (e.g., 25° C. or less).

A hot plate is preferably used in the heat treatment on the thin film in the first heat treatment. Concretely, a transparent substrate having the thin film for pattern formation on a main surface is placed on the hot plate, and the heat treatment is performed in oxygen-containing gas under the heating conditions given above. On the other hand, the heat treatment on the thin film in the second heat treatment is preferably performed using the vertical furnace disclosed in Japanese Patent Application Publication 2002-162726 or the vertical furnace disclosed in Japanese Patent Application Publication 2013-225109. Concretely, a transparent substrate with a thin film after the first heat treatment is placed on a quartz board placed in a heating/cooling chamber of a vertical furnace, gas containing oxygen (preferably, air passed through a chemical filter) is introduced into the heating/cooling chamber, and a heat treatment is performed under the above heating conditions. Incidentally, the vertical furnace disclosed in Japanese Patent Application Publication 2013-225109 has a cooling apparatus attached to an exterior of the heating/cooling chamber, which is for quickly returning the thin film and the substrate after the heat treatment to a normal temperature, and is not for quenching.

In addition to the above, other matters on the thin film for pattern formation after the second heat treatment are similar to the thin film for pattern formation of the mask blank of this invention described above.

In the case where the thin film for pattern formation is a phase shift film, the method for manufacturing the mask blank according to this invention preferably includes a step of forming a light shielding film on the thin film (phase shift film) after the second heat treatment. This is because, in the case of manufacturing a phase shift mask using a mask blank manufactured through the method for manufacturing a mask blank according to this invention, a light shielding film is necessary to form a light shielding band, etc. as mentioned above. Further, in this case, the light shielding film is preferably made of a material containing chromium.

The step of forming a light shielding film mentioned above includes placing a transparent substrate having a phase shift film on a substrate stage in a film-forming apparatus, at least introducing reactive gas and noble gas in the film-forming apparatus, applying voltage to a target containing chromium, and forming a light shielding film on the phase shift film through reactive sputtering. The method of the reactive sputtering is similar as above. The reactive gas to be introduced into the film-forming apparatus can include, e.g., $N_2$, $O_2$, NO, $NO_2$, and $CH_4$. Noble gas is similar to the case described above.

On the other hand, the method for manufacturing a transfer mask of the embodiment of this invention includes a step of forming a transfer pattern on the mask blank of the above embodiment, or the thin film for pattern formation of the mask blank manufactured by the method for manufacturing a mask blank of the above embodiment by dry etching. Fluorine-based gas is used for etching gas in dry etching of the thin film for pattern formation.

The above method for manufacturing a transfer mask is suitable for the manufacture of a phase shift mask. The method for manufacturing the phase shift mask 200 of this invention according to the embodiment is explained below according to the manufacturing steps shown in FIG. 2. The method explained herein is the method for manufacturing the phase shift mask 200 using the mask blank 100 having the hard mask film 4 stacked on the light shielding film 3. Further, a material containing chromium is applied to the light shielding film 3, and a material containing silicon is applied to the hard mask film 4.

First, a resist film was formed in contact with the hard mask film 4 of the mask blank 100 by spin coating. Next, a first pattern, which is a transfer pattern (phase shift pattern) to be formed on the phase shift film, was exposed and drawn with an electron beam on the resist film, and predetermined treatments such as developing were further conducted, to thereby form a first resist pattern 5a having a phase shift pattern (see FIG. 2(a)). Subsequently, dry etching was conducted using fluorine-based gas with the first resist pattern 5a as a mask, and a first pattern (hard mask pattern 4a) was formed on the hard mask film 4 (see FIG. 2(b)).

Next, after removing the first resist pattern 5a, dry etching was conducted using mixed gas of chlorine-based gas and oxygen gas with the hard mask pattern 4a as a mask, and a first pattern (light shielding pattern 3a) was formed on the light shielding film 3 (see FIG. 2(c)). Subsequently, dry etching was conducted using fluorine-based gas with the light shielding pattern 3a as a mask, and a first pattern (phase shift pattern 2a) was formed on the phase shift film 2, and at the same time the hard mask pattern 4a was removed (see FIG. 2(d)).

Next, a resist film was formed on the mask blank 100 by spin coating. Next, a second pattern, which is a pattern (light shielding band pattern) to be formed on the light shielding film 3, was exposed and drawn with an electron beam on the resist film, and predetermined treatments such as developing were conducted, to thereby form a second resist pattern 6b having a light shielding pattern (see FIG. 2(e)). Subsequently, dry etching was conducted using mixed gas of chlorine-based gas and oxygen gas with the second resist pattern 6b as a mask, and a second pattern (light shielding pattern 3b) was formed on the light shielding film 3 (see FIG. 2(f)). Further, the second resist pattern 6b was removed, predetermined treatments such as cleaning were conducted, and the phase shift mask 200 was obtained (see FIG. 2(g)).

There is no particular limitation to chlorine-based gas used for the dry etching described above, as long as chlorine (Cl) is included, for example, $Cl_2$, $SiCl_2$, $CHCl_3$, $CH_2Cl_2$, $CCl_4$, and $BCl_3$. Further, there is no particular limitation to fluorine-based gas to be used for the dry etching described above, as long as fluorine(F) is included, for example, $CHF_3$, $CF_4$, $C_2F_6$, $C_4F_8$, and $SF_6$. Particularly, fluorine-based gas free of carbon(C) can further reduce damage on a glass substrate for having a relatively low etching rate to a glass substrate, and is preferable.

The method for manufacturing a semiconductor device of this invention is characterized in using a transfer mask manufactured by using the mask blank described above, and exposure-transferring a pattern on a resist film on a semiconductor substrate. Therefore, a desired pattern can be transferred to an object to be transferred at a high precision, even if the transfer mask is set on an exposure apparatus and an exposure light is irradiated from the side of the transparent substrate 1 of the transfer mask to perform the exposure-transfer on the object to be transferred (resist film on semiconductor wafer, etc.).

On the other hand, by applying a structure similar to the thin film for pattern formation made of a material containing a metal, silicon, and nitrogen to a thin film for pattern formation made of a material containing silicon and nitrogen, a similar effect can be obtained. Namely, the mask blank of the second invention is a mask blank having a thin film for pattern formation on a transparent substrate, the thin film including a material containing silicon and nitrogen, or a material containing one or more elements selected from a metalloid element and a non-metallic element, and silicon and nitrogen, and in which when the thin film is subjected to an analysis of a secondary ion mass spectrometry and a distribution of a secondary ion intensity of silicon in depth direction (film thickness direction) is obtained, a ratio of a maximum peak [Counts/sec] of a secondary ion intensity of silicon at a surface layer region, which is opposite from a transparent substrate, of the thin film divided by an average value [Counts/sec] of a secondary ion intensity of silicon in a depth direction of an inner region, which is a region excluding the surface layer region and a vicinity region with an interface, of the transparent substrate of the thin film is 1.6 or less.

This mask blank of the second invention has significantly improved chemical resistance and durability to dry etching by mixed gas of chlorine-based gas and oxygen gas, even in the case where the thin film for pattern formation is made from a material made of silicon and nitrogen, or a material made of one or more elements selected from a metalloid element and a non-metallic element, and silicon and nitrogen. Therefore, the transfer mask manufactured from this mask blank can significantly extend its use life compared to conventional transfer masks. Further, a desired pattern can be transferred to an object to be transferred at a high precision, even if the transfer mask is set on an exposure apparatus and an exposure light is irradiated from the side of the transparent substrate of the transfer mask to perform the exposure-transfer on the object to be transferred (resist film on semiconductor wafer, etc.).

The thin film for pattern formation of the second invention does not contain a transition metal that may be a factor to reduce light fastness to an ArF exposure light. Further, the thin film for pattern formation preferably contains no metal element excluding transition metals, since possibility of being a factor to reduce light fastness to an ArF exposure light cannot be denied. In addition to silicon, this thin film for pattern formation can contain any metalloid elements. Among the metalloid elements, containing one or more elements selected from boron, germanium, antimony, and tellurium is preferable, since enhancement can be expected in conductivity of silicon used as a sputtering target.

The thin film for pattern formation of the second invention can include any non-metallic elements in addition to nitrogen. The non-metallic elements in this invention indicate those including non-metallic elements in a narrow sense (nitrogen, carbon, oxygen, phosphate, sulfur, selenium), halogen, and noble gas. Among the non-metallic elements, it is preferable to include one or more elements selected from carbon, fluorine, and hydrogen.

This thin film for pattern formation of the second invention can contain noble gas. Noble gas is an element that can increase deposition rate and enhance productivity when present in a film forming chamber upon forming a thin film through reactive sputtering. In reactive sputtering, the noble gas is plasmarized and collided on the target so that target-forming particles eject out from the target, and while incorporating reactive gas on the way, are stacked on the transparent substrate to form a thin film. Moreover, while the target-forming particles eject out from the target until adhered on the transparent substrate, a small amount of noble gas in the film forming chamber is incorporated. Preferable noble gas required for the reactive sputtering includes argon, krypton, and xenon. Further, to mitigate stress of the thin film, neon and helium having small atomic weight can be positively incorporated into the thin film.

Incidentally, the structures of the mask blank of the second invention other than the thin film for pattern formation are similar to the case of the mask blank of this invention.

On the other hand, the method of manufacturing the mask blank of the second invention is characterized in a method for manufacturing a mask blank including a thin film for pattern formation on a transparent substrate, including the steps of forming a thin film on a transparent substrate, the thin film made of a material made of silicon and nitrogen, or a material made of one or more elements selected from a metalloid element and a non-metallic element and silicon and nitrogen; performing a first heat treatment in which the thin film is subjected to a heat treatment in gas containing oxygen at a temperature below 300° C.; and performing a second heat treatment in which the thin film after the first heat treatment is subjected to a heat treatment in gas containing oxygen at a temperature of 300° C. or more.

The step of forming the thin film for pattern formation of the second invention includes placing a transparent substrate on a substrate stage in the film-forming apparatus, at least introducing nitrogen-based gas and noble gas in the film-forming apparatus, applying voltage on a silicon target or a target made of silicon and one or more elements selected from a metalloid element and a non-metallic element, and through reactive sputtering, forming a thin film for pattern formation on a main surface of the transparent substrate. While the procedure of the reactive sputtering is similar to the case of the step of forming the thin film for pattern formation of this invention, it is preferable to apply RF sputtering or ion beam sputtering in the case of using a target with low conductivity (e.g., silicon target, silicon compound target including less or free of metalloid element). Nitrogen gas or nitrogen compound gas is applied as the nitrogen-based gas to be introduced into the film-forming apparatus. The nitrogen-based gas herein includes, e.g., $N_2$, NO, $NO_2$, $NH_3$, and $HNO_3$. Particularly, nitrogen-based gas herein is preferably nitrogen gas. In the reactive sputtering of this case, it is preferable to select a film-forming condition where the sputtering gas has a mixing ratio of nitrogen gas that is greater than the scope of a mixing ratio of nitrogen gas that becomes a transition mode in which film formation tends to be unstable (film-forming condition in this case is a poison mode), or a film-forming condition where the sputtering gas has a mixing ratio of nitrogen gas that is less than the scope of a mixing ratio of nitrogen gas that becomes a transition mode (film-forming condition in this case is a metal mode). Due to the above, it will be possible to form a thin film for pattern formation with stable film thickness and composition between production lots.

Noble gas to be introduced into the film-forming apparatus can include helium, neon, argon, krypton, and xenon. Particularly, the noble gas herein is preferably mixed gas including helium and one or more gases selected from argon, krypton, and xenon. On the gas to be introduced into the film forming chamber, gas that is difficult to completely avoid mixture such as water vapor, gas in the atmosphere, outgas from a member in the film forming chamber, etc. may be included within the scope of not affecting various properties required for a thin film formed through reactive sputtering.

Incidentally, other matters in the method for manufacturing the mask blank of the second invention are similar to the case of the method for manufacturing the mask blank of this invention.

Further, the method for manufacturing a transfer mask from the mask blank of the second invention, and the method for manufacturing a semiconductor device using the transfer mask of the second invention manufactured by the manufacturing method are similar to the case of the method for manufacturing a transfer mask of this invention, and the method of manufacturing the semiconductor device of this invention.

EXAMPLES

The embodiments for carrying out this invention will be further explained concretely below by Example 1.

Example 1 and Comparative Example 1

[Manufacture of Mask Blank]

Four transparent substrates 1 made of a synthetic quartz glass with a size of a main surface of about 152 mm×about 152 mm and a thickness of about 6.35 mm were prepared. End surfaces and the main surfaces of the transparent substrates 1 were polished to a predetermined surface roughness, and thereafter subjected to predetermined cleaning treatment and drying treatment.

Next, the transparent substrates 1 were placed in a single-wafer DC sputtering apparatus, and by reactive sputtering (DC sputtering) using a mixed target of molybdenum(Mo) and silicon(Si) (Mo:Si=12 atom %:88 atom %) and with mixed gas of argon(Ar), nitrogen($N_2$), and helium(He) as sputtering gas, a phase shift film (thin film for pattern formation) 2 made of molybdenum, silicon, nitrogen, and oxygen was formed on each of the four transparent substrates 1 at a thickness of 69 nm. Among the four transparent substrates 1 having the phase shift films 2 (hereafter referred to as the substrate with thin film), two are used to manufacture the mask blank of Example 1, and the remaining two are used to manufacture the mask blank of Comparative Example 1.

Next, the two substrates with thin film of Example 1 were each subjected to a first heat treatment on a hot plate. Concretely, the substrates with thin film of Example 1 were placed on a hot plate, and subjected to annealing under the treatment conditions of heating temperature of 280° C. and heating time of 5 minutes in the atmosphere. The two substrates with thin film of Example 1 after the annealing were left in the atmosphere until they reached a normal temperature (25° C. or less).

Next, the two substrates with thin film of Example 1 subjected to the first heat treatment and the two substrates with thin film of Comparative Example 1 were subjected to a second heat treatment. Concretely, the above substrates were placed vertically and spaced apart from each other on substrate supports of each stage on a quartz board positioned in a heating/cooling chamber of a vertical furnace disclosed in Japanese Patent Application Publication 2013-225109. In this occasion, a transparent substrate without a phase shift film (dummy substrate) was placed on the substrate supports of the topmost stage and the bottommost stage of the quartz board. The reason for placing the dummy substrate is that the topmost stage and the bottommost stage are likely to be affected by disturbance, etc.

The heat treatment (annealing) on the four substrates with thin film was performed for one hour from initiation of heating by a heater (heating apparatus) until the temperature in the heating/cooling chamber reached 450° C., under the condition where gas in the heating/cooling chamber is regularly exchanged with the air passed through a chemical filter. Immediately after the heating from the heater was stopped, injection of a cooling medium from a coolant tube was started, and compulsory cooling was made until inside of the heating/cooling chamber reached a normal temperature.

On each substrate with thin film of Example 1 and Comparative Example 1 after the second heat treatment, transmittance and phase difference of the phase shift film 2 to a light of 193 nm wavelength were measured using a phase shift measurement device (MPM193 manufactured by Lasertec), resulting in a transmittance of 6.1% and phase difference of 177.0 degrees. There was substantially no difference in optical characteristics between the phase shift film 2 of Example 1 and the phase shift film 2 of Comparative Example 1.

Figure 3:
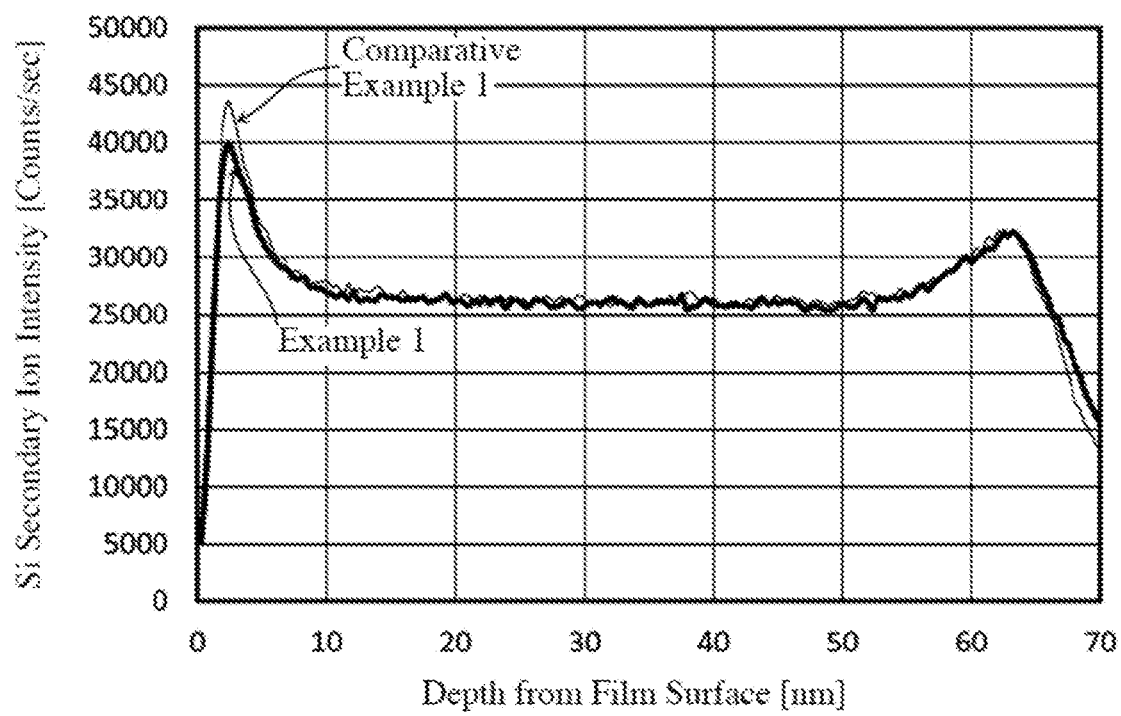
FIG. 3 shows a result of a secondary ion intensity of silicon obtained by an analysis of a secondary ion mass spectrometry on the thin film of the mask blank of Example 1 and Comparative Example 1.
Figure 4:
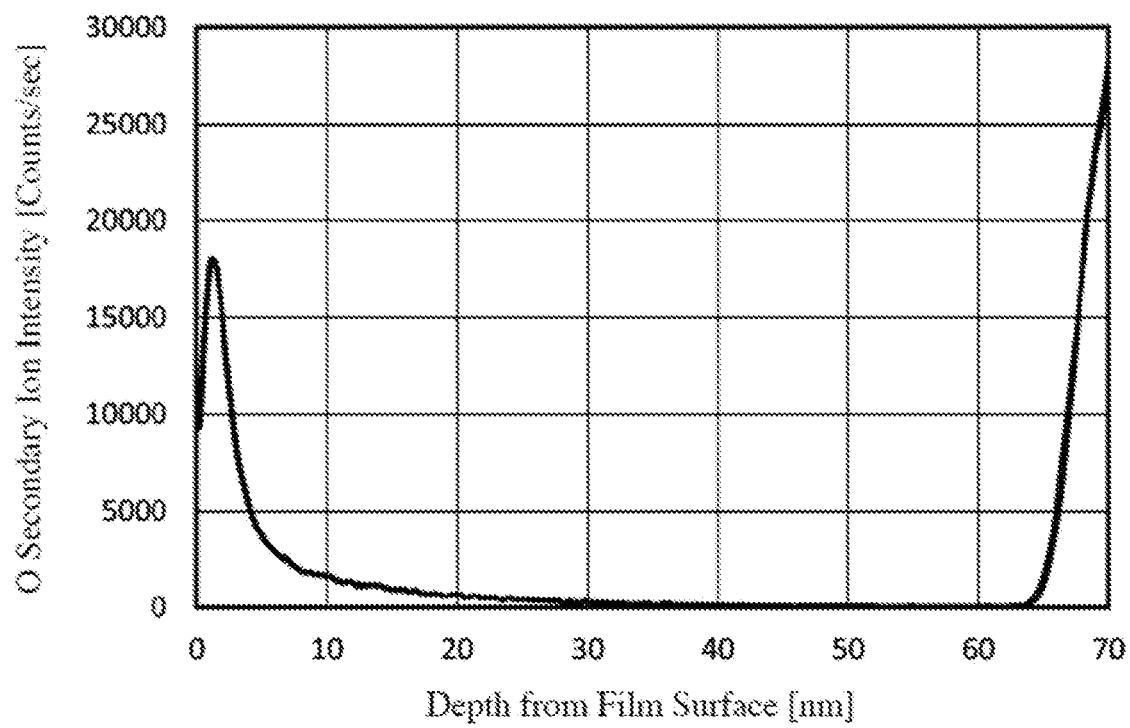
FIG. 4 shows a result of a secondary ion intensity of oxygen obtained by an analysis of a secondary ion mass spectrometry on the thin film of the mask blank of Example 1 and Comparative Example 1.

Next, one substrate with thin film of Example 1 and one phase shift film 2 of the substrate with thin film of Comparative Example 1 were analyzed on the depth direction (film thickness direction) with a secondary ion mass spectrometry (SIMS). The analysis was performed using a quadrupole secondary ion mass spectrograph (PHI ADEPT1010 manufactured by ULVAC-PHI, Inc.) as an analysis device, under the analysis conditions where primary ion species is $Cs^+$, primary accelerating voltage is 2.0 kV, and an irradiating region of a primary ion is an inner region of a square having a side of 120 μm. The result of the analysis of the secondary ion intensity of silicon(Si) in depth direction in each phase shift film 2 of Example 1 and Comparative Example 1 obtained as a result of the analysis is shown in FIG. 3 (Example is expressed in bold lines, Comparative Example 1 in thin lines). Further, the result of the analysis of the secondary ion intensity of oxygen(O) in depth direction in each phase shift film 2 of Example 1 and Comparative Example 1 is shown in FIG. 4 (Example 1 is expressed in bold lines, Comparative Example 1 in thin lines).

In view of the result of FIG. 3, it can be understood that in both of the phase shift films 2 of Example 1 and Comparative Example 1, clear maximum peak is detected in a secondary ion intensity of silicon in the region (surface layer region) from the surface of the phase shift film 2 up to a depth of 10 nm. However, maximum peak Si_max of a secondary ion intensity of silicon of the phase shift film 2 of Example 1 clearly shows a smaller value compared to maximum peak Si_max of a secondary ion intensity of silicon of the phase shift film 2 of Comparative Example 1. There was substantially no difference between the phase shift film 2 of Example 1 and the phase shift film 2 of Comparative Example 1 in the distribution of a secondary ion intensity of silicon in depth direction in the phase shift film 2 from an interface of the transparent substrate 1 to the region (vicinity region) up to 20 nm toward the surface layer region. On the other hand, in view of the result of FIG. 4, it was found that there is no substantial difference in the result of analysis of a secondary ion intensity of oxygen(O) in depth direction between each phase shift film 2 of Example 1 and Comparative Example 1 (bold lines of Example 1 and thin lines of Comparative Example 1 are almost superimposed).

There was substantially no difference between the phase shift film 2 of Example 1 and the phase shift film 2 of Comparative Example 1 in the distribution of a secondary ion intensity of silicon in depth direction in the phase shift film 2 in the region (inner region) in depth direction excluding the surface layer region and the vicinity region, and also in the average value Si_avg of a secondary ion intensity of silicon in depth direction of the inner region. Further, Si_max/Si_avg ratio of the phase shift film 2 of Example 1 was calculated, and the value was 1.53. On the other hand, Si_max/Si_avg ratio of the phase shift film 2 of Comparative Example 1 was calculated, and the value was 1.65.

On each of the substrates with thin film of Example 1 and Comparative Example 1 subjected to the analysis by SIMS in depth direction, composition analysis by X-ray photoelectron spectroscopy was conducted on a region other than the region in plain view of the phase shift film 2 subjected to the analysis by SIMS. As a result, there was substantially no difference in the result of composition analysis between the phase shift film 2 of Example 1 and the phase shift film 2 of Comparative Example 1. Incidentally, the compositions of the inner regions of the phase shift films 2 of Example 1 and Comparative Example 1 were both molybdenum (Mo)=5.7[atom %], silicon (Si)=45.4[atom %], and nitrogen (N)=48.9[atom %]. Further, ratio (percentage; the ratio is hereafter referred to as "Mo/[Mo+Si] ratio") of molybdenum content [atom %] divided by a total content [atom %] of molybdenum and silicon in the phase shift film 2 was 11.2%.

Next, on each of the remaining substrates with thin film of Example 1 and Comparative Example 1 that were not subjected to the analysis, etc. in depth direction by SIMS, the light shielding film 3 and the hard mask film 4 were formed by the following procedure. The transparent substrate 1 having the phase shift film 2 formed thereon was placed in a single-wafer DC sputtering apparatus, and by reactive sputtering (DC sputtering) using a chromium(Cr) target, with mixed gas of argon(Ar), carbon dioxide($CO_2$), nitrogen($N_2$), and helium(He) (flow ratio Ar:$CO_2$:$N_2$:He=22:39:6:33, pressure=0.2 Pa) as sputtering gas, and with electric power from DC power source at 1.9 kW, a lowermost layer of the light shielding film 3 made of CrOCN was formed on the phase shift film 2 at a thickness of 30 nm.

Next, by reactive sputtering (DC sputtering) using the same chromium(Cr) target with mixed gas of argon(Ar) and nitrogen($N_2$) (flow ratio Ar:$N_2$=83:17, pressure=0.1 Pa) as a sputtering gas, and with electric power from DC power source at 1.4 kW, a lower layer of the light shielding film 3 made of CrN was formed on the lowermost layer of the light shielding film 3 at a thickness of 4 nm.

Next, by reactive sputtering (DC sputtering) using the same chromium(Cr) target, with mixed gas of argon(Ar), carbon dioxide($CO_2$), nitrogen($N_2$), and helium(He) (flow ratio Ar:$CO_2$:$N_2$:He=21:37:11:31, pressure=0.2 Pa) as sputtering gas, and with electric power from DC power source at 1.9 kW, an upper layer of the light shielding film 3 made of CrOCN was formed on the lower layer of the light shielding film 3 at a thickness of 14 nm. By the above procedure, the light shielding film 3 made of a chromium-based material of a three-layer structure including the lowermost layer of CrOCN, the lower layer of CrN, and the upper layer of CrOCN, in order from the phase shift film side, was formed at a total film thickness of 48 nm. The optical density (OD) to light of 193 nm wavelength of the stacked structure of the phase shift film 2 and the light shielding film 3 was 3.0 or more.

Further, the transparent substrate 1 with the phase shift film 2 and the light shielding film 3 stacked thereon in this order was placed in a single-wafer RF sputtering apparatus, and by RF sputtering using a silicon dioxide ($SiO_2$) target with argon(Ar) gas as sputtering gas, a hard mask film 4 made of silicon and oxygen was formed on the light shielding film 3 at a thickness of 5 nm. Through the above procedure, the mask blank 100 of Example 1 and the mask blank Comparative Example 1, one for each, were formed, each having a structure where the phase shift film 2, the light shielding film 3, and the hard mask film 4 are stacked on the transparent substrate 1.

[Manufacture of Phase Shift Mask]

Next, the phase shift mask 200 of Example 1 and the phase shift mask of Comparative Example 1 were each manufactured through the following procedure using the mask blank 100 of Example 1 and the mask blank of Comparative Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed on the phase shift film 2, was drawn on the resist film with electron beam, predetermined cleaning and developing treatments were conducted, and a first resist pattern 5a having the first pattern was formed (see FIG. 2(a)).

Next, dry etching using $CF_4$ gas was conducted with the first resist pattern 5a as a mask, and the first pattern (hard mask pattern 4a) was formed on the hard mask film 4 (see FIG. 2(b)).

Subsequently, the first resist pattern 5a was removed. Next, dry etching (high bias etching with 50[W] power when bias voltage is applied) was conducted using mixed gas of chlorine and oxygen (gas flow ratio $Cl_2:O_2=13:1$) with the hard mask pattern 4a as a mask, and a first pattern (light shielding pattern 3a) was formed on the light shielding film 3 (see FIG. 2(c)). Next, dry etching was conducted using fluorine-based gas ($SF_6$+He) with the light shielding pattern 3a as a mask, and a first pattern (phase shift pattern 2a) was formed on the phase shift film 2, and at the same time the hard mask pattern 4a was removed (see FIG. 2(d)).

Next, a resist film of a chemically amplified resist for electron beam writing was formed on the light shielding pattern 3a by spin coating at a film thickness of 150 nm. Next, a second pattern, which is a pattern (light shielding band pattern) to be formed on the light shielding film, was exposed and drawn on the resist film, further subjected to predetermined treatments such as developing, and a second resist pattern 6b having a light shielding pattern was formed (see FIG. 2(e)). Subsequently, dry etching (high bias etching with 50[W] power when bias voltage is applied) was conducted using mixed gas of chlorine and oxygen (gas flow ratio $Cl_2:O_2=13:1$) with the second resist pattern 6b as a mask, and a second pattern (light shielding pattern 3b) was formed on the light shielding film 3 (see FIG. 2(f)). Further, the second resist pattern 6b was removed, predetermined treatments such as cleaning were carried out, and the phase shift mask 200 of Example 1 and the phase shift mask of Comparative Example 1 were obtained (see FIG. 2(g)).

Next, for each of the manufactured phase shift mask 200 of Example 1 and the phase shift mask of Comparative Example 1, a cleaning step (cleaning of phase shift mask) was conducted using an alkaline solution under the same condition. The alkaline solution to be used in the cleaning step is a solution of ammonium hydroxide ($NH_4OH$ concentration 25 wt %):hydrogen peroxide ($H_2O_2$ concentration 30 wt %):water($H_2O$)=2:1:4 (volume ratio). Cleaning time in the cleaning step was 60 minutes. Further, each phase shift mask 200 after the cleaning step using the alkaline solution was rinsed using DIW (DeIonized Water). As a result, regardless of the same cleaning condition, the amount of film loss of the phase shift mask 200 of Example 1 was reduced down to ½ or less than the amount of film loss of the phase shift mask of Comparative Example 1. Namely, the amount of film loss by mask cleaning is reduced in the phase shift mask 200 of Example 1, which is considered as having improved chemical resistance.

[Evaluation of Pattern Transfer Performance]

On the phase shift mask 200 of Example 1 after the cleaning step, a simulation of a transfer image was made when an exposure transfer was made on a resist film on a semiconductor device using AIMS193 (manufactured by Carl Zeiss) at an exposure light of wavelength 193 nm. The simulated exposure transfer image was inspected, and the design specification was fully satisfied. It can be considered from this result that a circuit pattern to be finally formed on the semiconductor device can be formed at a high precision, even if the phase shift mask 200 of Example 1 after the cleaning step was set on a mask stage of an exposure apparatus and a resist film on the semiconductor device was subjected to exposure transfer.

On the other hand, on the phase shift mask of Comparative Example 1 after the cleaning step as well, a simulation of a transfer image was made when an exposure transfer was made on a resist film on a semiconductor device using AIMS193 (manufactured by Carl Zeiss) at an exposure light of wavelength 193 nm, similarly as Example 1. The exposure transfer image of this simulation was verified, and a transfer defect was confirmed. Generation factor of the transfer defect is inferred as a large amount of film loss of the phase shift pattern 2a. From this result, it can be considered that when the phase shift mask of Comparative Example 1 was set on a mask stage of an exposure apparatus and exposure-transferred to a resist film on a semiconductor device, a defected area will generate on a circuit pattern to be finally formed on the semiconductor device.

Comparative Example 2, Comparative Example 3

[Manufacture of Mask Blank]

The mask blanks of Comparative Example 2 and Comparative Example were manufactured through the same procedure as the mask blanks of Example 1 and Comparative Example 1, except for the phase shift film 2. The phase shift film 2 of Comparative Example 1 significantly differs from the phase shift films 2 of Example 1 and Comparative Example 1 in that Mo/[Mo+Si] ratio of the target is changed. Concretely, the transparent substrate 1 was placed in a single-wafer DC sputtering apparatus, and by reactive sputtering (DC sputtering) using a mix-sintered target of molybdenum(Mo) and silicon(Si) (Mo:Si=21 atom %:79 atom %) with mixed gas of argon(Ar), nitrogen($N_2$), and helium(He) as sputtering gas, the phase shift film 2 made of molybdenum, silicon, nitrogen, and oxygen was formed at a thickness of 93 nm. Among the four transparent substrates 1 having phase shift films (hereafter referred to as the substrate with thin film), two are used to manufacture the mask blank of Comparative Example 2, and the remaining two are used to manufacture the mask blank of Comparative Example 3.

Next, the two substrates with thin film of Comparative Example 2 were each subjected to a first heat treatment on a hot plate, similarly as Example 1. Subsequently, the two substrates with thin film of Comparative Example 2 subjected to the first heat treatment and the two substrates with thin film of Comparative Example 3 were subjected to a second heat treatment similar to Example 1 and Comparative Example 1.

On each substrate with thin film of Comparative Example 2 and Comparative Example 3 after the second heat treatment, transmittance and phase difference of the phase shift film 2 to a light of 248 nm wavelength were measured using a phase shift measurement device (MPM248 manufactured by Lasertec), both resulting in a transmittance of 5.5% and phase difference of 177.0 degrees. There was substantially no difference in optical characteristics between the phase shift film 2 of Comparative Example 2 and the phase shift film 2 of Comparative Example 3.

Next, the phase shift films 2 of one substrate with thin film of Comparative Example 2 and one substrate with thin film of Comparative Example 3 were analyzed on the depth direction (film thickness direction) with a secondary ion mass spectrometry (SIMS), similar to the case of Example 1. The result of the analysis of the secondary ion intensity of silicon(Si) in depth direction in each phase shift film 2 of Comparative Example 2 and 3 is shown in FIG. 5 (Comparative Example 2 is expressed in bold lines, Comparative Example 3 in thin lines).

Figure 5:
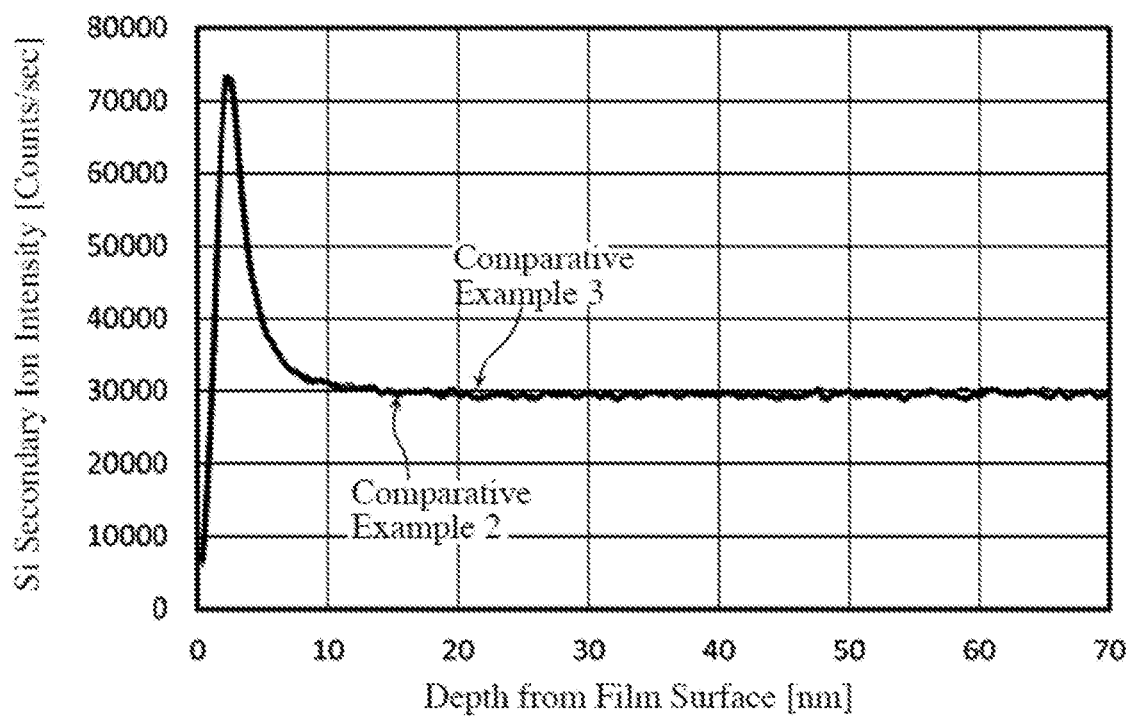
FIG. 5 shows a result of a secondary ion intensity of silicon obtained by an analysis of a secondary ion mass spectrometry on the thin film of the mask blank of Comparative Example 2 and Comparative Example 3.
Figure 6:
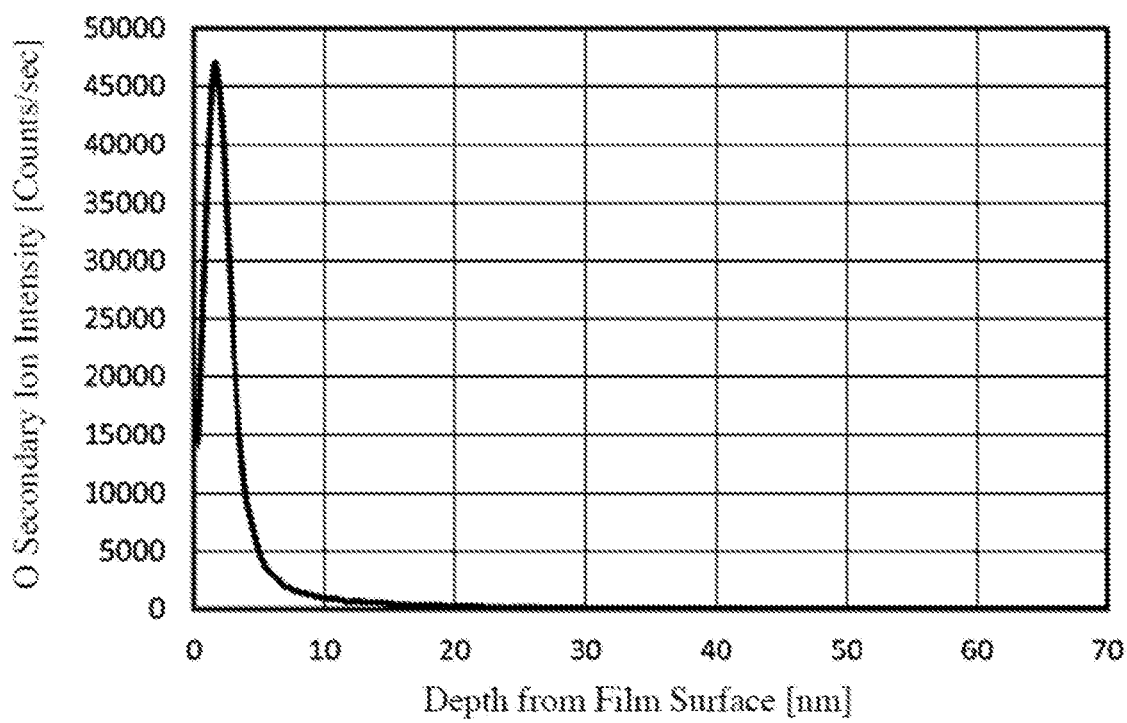
FIG. 6 shows a result of a secondary ion intensity of oxygen obtained by an analysis of a secondary ion mass spectrometry on the thin film of the mask blank of Comparative Example 2 and Comparative Example 3.

In view of the result of FIG. 5, it can be understood that in both of the phase shift films 2 of Comparative Example 2 and Comparative Example 3, clear maximum peak is detected in a secondary ion intensity of silicon in the region (surface layer region) from the surface of the phase shift film 2 up to a depth of 10 nm. However, no substantial difference was observed in maximum peak Si_max of a secondary ion intensity of silicon of the phase shift film 2 of Comparative Example 2 and the phase shift film 2 of Comparative Example 3. Further, there was substantially no difference between the phase shift film 2 of Comparative Example 2 and the phase shift film 2 of Comparative Example 3 in the distribution of a secondary ion intensity of silicon in depth direction in the phase shift film 2 from an interface of the transparent substrate 1 to the region (vicinity region) up to 20 nm toward the surface layer region (bold lines of Comparative Example 2 and thin lines of Comparative Example 3 are almost superimposed). On the other hand, in view of the result of FIG. 6, it was found that there is no substantial difference between the phase shift film 2 of Comparative Example and the phase shift film 2 of Comparative Example 3 in the result of analysis of a secondary ion intensity of oxygen(O) in depth direction (bold lines of Comparative Example 2 and thin lines of Comparative Example 3 are almost superimposed).

There was substantially no difference between the phase shift film 2 of Comparative Example 2 and the phase shift film 2 of Comparative Example 3 in the distribution of a secondary ion intensity of silicon in depth direction in the phase shift film 2 in the region (inner region) in depth direction excluding the surface layer region and the vicinity region, and also in the average value Si_avg of a secondary ion intensity of silicon in depth direction of the inner region. Si_max/Si_avg ratio for each of the phase shift film 2 of Comparative Example 2 and the phase shift film 2 of Comparative Example 3 were calculated, and the value for both was 2.45.

On each of the substrates with thin film of Comparative Example 2 and Comparative Example 3 subjected to the analysis by SIMS in depth direction, composition analysis by X-ray photoelectron spectroscopy was conducted on a region other than the region in plain view of the phase shift film 2 subjected to the analysis by SIMS. As a result, there was substantially no difference in the result of composition analysis between the phase shift films 2 of Comparative Example 2 and Comparative Example 3. Further, ratio of molybdenum content [atom %] divided by a total content [atom %] of molybdenum and silicon (the ratio is hereafter referred to as "Mo/[Mo+Si] ratio") in the phase shift film 2 of Comparative Example 2 and 3 was 20.2% in each instance.

Next, the light shielding film 3 was formed on each of the remaining substrates with thin film of Comparative Example 2 and Comparative Example 3 that were not subjected to analysis by SIMS in depth direction, etc. This light shielding film 3 is similar to the light shielding film 3 of Example 1 except for the thickness of the lower layer (CrN) which has been changed to 14 nm (i.e., thickness of the light shielding film 3 is 58 nm). Incidentally, an optical density (OD) to a light of wavelength 248 nm in the stacked structure of the phase shift film 2 and the light shielding film 3 was measured, and the value was 3.0 or more. Moreover, a hard mask film 4 was formed on the light shielding film 3 under the same condition as Example 1. Through the above procedure, the mask blanks of Comparative Example 2 and Comparative Example 3 having a structure where the phase shift film 2, the light shielding film 3, and the hard mask film 4 are stacked on the transparent substrate were formed.

[Manufacture of Phase Shift Mask]

Next, the mask blanks of Comparative Example 2 and Comparative Example 3 were used to manufacture the phase shift masks of Comparative Example 2 and Comparative Example 3 through the procedure similar to Example 1.

Next, on each of the manufactured phase shift mask of Comparative Example 2 and the phase shift mask of Comparative Example 3, a cleaning step (cleaning of phase shift mask) was performed using an alkaline solution similarly as Example 1. As a result, the amount of film loss in the phase shift mask of Comparative Example 2 and the phase shift mask of Comparative Example 3 was further increased compared to the amount of film loss in the phase shift mask of Comparative Example 1.

[Evaluation of Pattern Transfer Performance]

On each of the phase shift masks of Comparative Example 2 and Comparative Example 3 after the cleaning step, a simulation of a transfer image was made when an exposure transfer was made on a resist film on a semiconductor device using AIMS248 (manufactured by Carl Zeiss) at an exposure light of wavelength 248 nm. The exposure transfer image of this simulation was verified, and a transfer defect was confirmed. Generation factor of the transfer defect is inferred as a large amount of film loss in the phase shift pattern 2a. From this result, it can be considered that when the phase shift masks of Comparative Example 2 and Comparative Example 3 were set on a mask stage of an exposure apparatus and exposure-transferred to a resist film on a semiconductor device, a defected area will generate on a circuit pattern to be finally formed on the semiconductor device.

REFERENCE NUMERALS 1 transparent substrate
2 phase shift film (thin film for pattern formation)
2a phase shift pattern
3 light shielding film
3a,3b light shielding pattern
4 hard mask film
4a hard mask pattern
5a first resist pattern
6b second resist pattern
100 mask blank
200 phase shift mask

The invention claimed is:
1. A mask blank comprising a thin film for pattern formation on a transparent substrate,
    wherein the thin film is made of a material containing a metal, silicon, and nitrogen, wherein a ratio of a content (using atomic percentage) of the metal in the thin film to a total content (using atomic percentage) of the metal and silicon in the thin film is 15% or less, and wherein a surface layer region is a region of the thin film that ranges from a surface on the thin film opposite from the transparent substrate to a depth of 10 nanometers toward the transparent substrate, wherein a vicinity region is a region of the thin film that ranges from an interface between the thin film and the transparent substrate to a depth of 20 nanometers toward the surface layer region, wherein a distribution of a secondary ion intensity of silicon in depth direction that is obtained by secondary ion mass spectrometry analysis of the thin film, a ratio Si_ax/Si_avg is 1.6 or less, where Si_max denotes a maximum peak value (measured in counts per second) of the secondary ion intensity of silicon in a surface layer region, and Si_avg denotes an average value (measured in counts per second) of the secondary ion intensity of silicon in a depth direction of an inner region of the thin film, the inner region excluding the surface layer region and the vicinity region, wherein a primary ion exposure condition is not changed during the secondary ion mass spectrometry analysis, and wherein a distribution of the secondary ion intensity of silicon in a depth direction is obtained under a measurement condition where a primary ion species is $Cs^+$, a primary accelerating voltage is 2.0 kV, and an irradiating region of a primary ion is the inner region of a square having a side of 120 μm.

2. The mask blank according to claim 1, wherein when the thin film is subjected to an analysis of a secondary ion mass spectrometry and a distribution of a secondary ion intensity of oxygen in depth direction is obtained, an average value of the secondary ion intensity of oxygen of the inner region in a depth direction is 2000 (measured in counts per second) or less.

3. The mask blank according to claim 1, wherein the thin film is a phase shift film having a function to transmit an ArF excimer laser exposure light at a transmittance of 1% or more, and a function to generate a phase difference of 150 degrees or more and 190 degrees or less between the exposure light transmitted through the thin film and the exposure light transmitted through air for a same distance as a thickness of the thin film.

4. The mask blank according to claim 3, wherein a light shielding film is provided on the phase shift film.

5. The mask blank according to claim 4, wherein the light shielding film is made of a material containing chromium.

* * * * *